METHOD FOR PROVIDING A PLANAR TRANSISTOR WITH HEAT-DISSIPATING TOP BASE AND EMITTER CONTACTS

Filed March 22, 1968 3 Sheets-Sheet 1

Richard J. Belardi,
INVENTOR.
BY.
W Hhea Allister Jr.
ATTORNEY.

March 2, 1971 R. J. BELARDI 3,567,506

METHOD FOR PROVIDING A PLANAR TRANSISTOR WITH HEAT-DISSIPATING TOP BASE AND EMITTER CONTACTS

Filed March 22, 1968 3 Sheets-Sheet 2

1

3,567,506
METHOD FOR PROVIDING A PLANAR TRANSISTOR WITH HEAT-DISSIPATING TOP BASE AND EMITTER CONTACTS

Richard J. Belardi, Anaheim, Calif., assignor to Hughes Aircraft Company, Culver City, Calif.

Filed Mar. 22, 1968, Ser. No. 715,349
Int. Cl. H01l 7/00
U.S. Cl. 117—212 8 Claims

ABSTRACT OF THE DISCLOSURE

A method for providing heat-dissipating top contacts for the base and emitter regions of a planar transistor having a glass coating on the surface thereof in which the heat-dissipating members are formed by plating metal through openings in the glass coating.

Figure 1A:
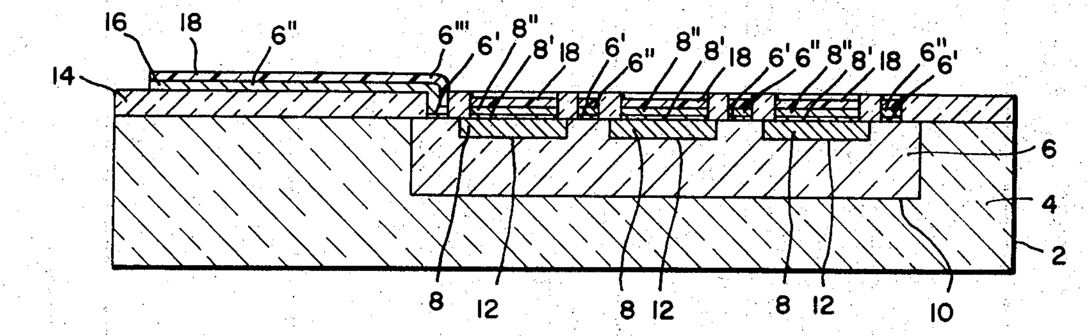

This invention relates to the fabrication of semiconductor devices and especially power transistors. More particularly but not necessarily exclusively, the invention relates to planar power transistors of the type having a plurality of emitters disposed on a common surface of the device body and to methods for manufacturing such devices.

When attempting to operate high power planar transistors at high frequencies, one of the problems encountered is dissipation of the rather considerable heat that is generated which if not properly accomplished can deleteriously affect either device operation or life (or both). The problem is particularly acute in planar transistor structures because of the extremely small size of the emitter and base elements as well as their location on a single surface of a semiconductor body which surface is usually provided with an electrically and therefore thermally insulating coating. Since a large percentage of the heat developed is generated at the emitter-base junction, a relatively long thermal path through the semiconductor body, to the opposite surface to that on which the emitter and base regions are disposed, must be traversed if the heat is to be dissipated from this "back" surface as by mounting the device body on a heat-sinking structure. Since semiconductors are not good thermal conductors in comparison with metals, such a solution is far from optimum and is completely unsatisfactory in instances where the device cannot be mounted by its "back" surface on a good heat sink as is the case when the device is disposed on an insulating substrate in integrated circuitry application.

In attempting to provide a heat sink structure on the surface of the semiconductor device body on which the emitter and base regions are disposed, one is faced with the problems obtaining a good thermal connection to parts or regions which are extremely small and must not be electrically shorted to each other. This surface, as indicated previously, is usually provided with an electrically insulating coating consisting of one or more layers of silicon oxide and glass, for example, which are not particularly good heat conductors. This means that the heat-dissipating paths must usually be confined to contacting the base and emitter regions themselves and particularly the emitter region or regions since this is where most of the heat is generated in operation. Since the emitter regions are each closely adjacent to the electrical contacts to the base region, there is an excellent possibility of electrically shorting the emitters and bases to each other when attempting to obtain good heat conduction paths from the emitter regions by metallic structures.

It is therefore an object of the present invention to provide an improved method for fabricating planar transistors.

2

Another object of the invention is to provide an improved method for fabricating planar transistors having a plurality of emitters.

Yet another object of the invention is to provide an improved method for providing planar transistors with a superior heat-dissipating structure.

These and other objects and advantages of the invention are realized by providing an opening through the protective insulating coating on the surface of a planar transistor to expose at least portions of the underlying emitter regions and to thereafter form a metallic heat-dissipating structure on the insulating coating by electroplating which heat-dissipating structure is electrically and thermally connected to the emitter regions and serves both as a good thermal conductor to a heat-sink and as an electrical contact for the emitter regions as well.

Figure 1B:
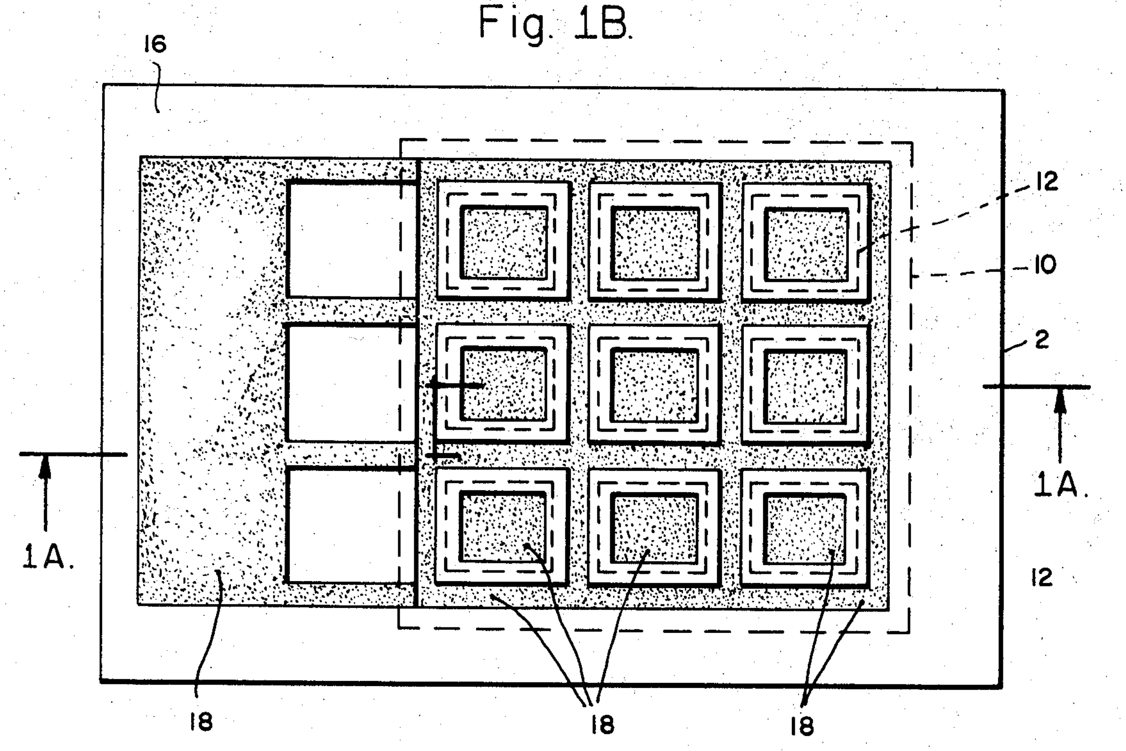
Figure 2:
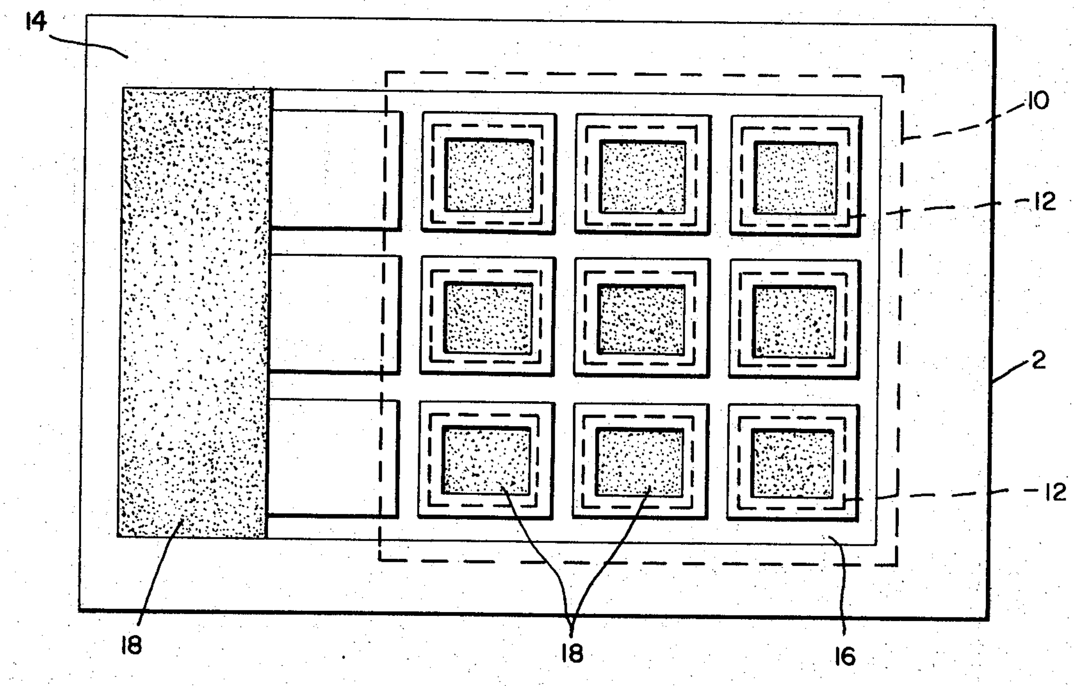

The invention will be described in greater detail by reference to the drawings in which:

FIG. 1*a* is an elevational, cross-sectional view of a planar transistor having a plurality of emitter regions;

FIG. 1*b* is a plan view of the planar transistor shown in FIG. 1*a*;

FIG. 2 is a plan view of the planar transistor shown in FIGS. 1*a* and 1*b* at a subsequent stage in the processing thereof according to the invention; and FIGS. 3 through 8 are elevational, cross-sectional views of the planar transistor shown in the previous figures but at successively succeeding stages in the processing thereof according to the invention.

With reference to FIGS. 1*a* and 1*b* a planar transistor device is shown comprising a semiconductor body 2, which may be of silicon for example, having a bulk portion of a given conductivity type constituting a collector region 4. Formed in and adjacent one surface of the semiconductor body 2 is a base region 6 of opposite conductivity type to that of the collector region 4. Likewise, formed in and adjacent the surface of the base region 6 are a plurality of emitter regions 8 which are of the same type of conductivity as the collector region 4. Any number of emitter regions may be utilized as desired; the nine regions shown in the figures are merely an arbitrarily chosen number for convenience of illustration and description. It will be seen that the base-collector junction 10 and the emitter-base junctions 12 extend to and terminate at the same surface of the semiconductor body 2 which is one of the distinguishing features of a planar transistor. Disposed over and protecting this surface and the P-N junctions extending thereto is an electrically insulating coating 14 which may be an oxide of the semiconductor body (e.g., silicon dioxide). This oxide is also used in the formation of the base and emitter regions which is achieved by the process of diffusion as is well known in the art as typified by U.S. Pat. No. 3,025,589 to J. A. Hoerni. This oxide serves as a mask against diffusion of conductivity-type-determining impurities and may be readily opened and closed by known etching and oxidizing procedures, respectively, at selected portions to permit the diffusion to occur where desired. The oxide coating 14 is left in place so that at the conclusion of the various diffusion operations the coating may serve to protect the device surface and particularly the underlying P-N junctions against the deleterious effects of the atmosphere or environment.

By standard photoresist masking and etching procedures, openings are provided through the oxide coating 14 to expose preselected areas of the base and emitter regions 6 and 8, respectively. More precisely, there is a discrete opening to each emitter region which is, in general, symmetrically centered with respect to its emitter region while the opening to the base region is a continuous one which is symmetrically disposed so as to expose the base region between and around each emitter region. The purpose of these openings in the protective oxide is to permit the provision therethrough of electrical connections or "contacts" to the base and emitter regions without exposing the respective P-N junctions.

After the formation of these openings through the oxide film 14 to the base and emitter regions, metal such as gold or platinum, for example, is vapor-deposited or sputtered over the entire surface of the device body. This metal will be deposited not only on the oxide film 14 but also on the surfaces of the base and emitter regions exposed through the openings in the oxide film to constitute base and emitter contact members 6′ and 8′, respectively. However, since neither gold nor platinum adhere to or alloy with silicon dioxide, any gold or platinum deposited on the oxide may be readily removed so that the gold or platinum remains in contact only with the base and emitter regions within the windows in the oxide film. The gold or platinum is alloyed to the exposed silicon in the windows.

Thereafter a metal is vapor-deposited or sputtered to form a layer 16 over the entire surface of the device body, again covering not only the oxide film 14 but also the gold or platinum base and emitter contacts 6′ and 8′. This metal should be one which will adhere well to silicon dioxide. Where gold is used to form the contacts in the windows, chromium-gold should be used for this purpose; where platinum is used for the contacts, this metal should be titanium. The portions 6″ and 8″ of the metal layer 16, which are deposited onto the base and emitter contact members 6′ and 8′ in the appropriate windows in the oxide film 14, remain therin as permanent portions of the base and emitter contact structures which are hereinafter generally identified by the reference numerals 6′ and 8′, respectively. The continuous film 16 of metal is coated with a film 18 of photoresist and is exposed to a light image corresponding to the desired metal pattern to be formed. Thus, what is desired is not only to have a pattern comprising discrete isolated contacts 8′ for each emitter region and continuous strip-like contacts 6′ for the base region, but also a pattern defining a large base connection element or "pad" 6″ connected to the base contact strips 6′ by base interconnect strips 6‴. To achieve such a pattern the photoresist film 18 is so exposed and then etched or otherwise removed so that portions of the photoresist film remain in situ where the metal of the film 16 is desired to be retained for the aforesaid purposes while portions of the metal not desired to be retained are exposed. Such a pattern of metal and photoresist film is shown in FIG. 1*b*. The exposed metal film 16 is then removed as by etching.

With reference to FIG. 2, the next step is to remove by conventional solutions the photoresist film 18 from over the base contact and interconnect strips 6′ and 6‴ only while leaving the photoresist coating on the base connection or bonding pad 6″ and on the emitter contacts 8′.

Figure 3:
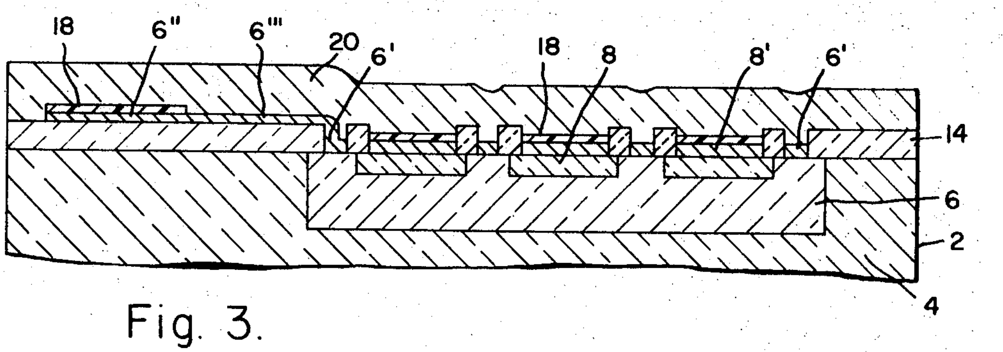

A coating 20 of an insulating material as silicon oxide or beryllium oxide or glass is then deposited as by sputtering over the entire device surface as shown in FIG. 3. Beryllium oxide is of exceptional advantage because it is a good electrical insulator as well as a good thermal conductor. This coating 20 thus completely covers the remaining portions of the photoresist film 18 on the base connection pad 6″ and the emitter contacts 8′ as well as the exposed base interconnection and contact strips 6‴ and 6′, respectively. In addition, exposed portions of the initial oxide film 14 are also now covered with this additional insulating coating 20.

Figure 4:
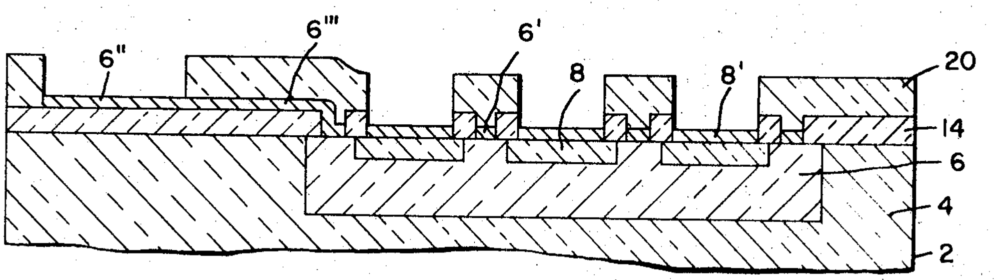

As indicated in FIG. 4, the portions of the insulating or glass coating 20 overlying the photoresist film portions on the base connection pad 6″ and the emitter contacts 8′ are now removed along with the photoresist film portions by heating the assembly to an elevated temperature so that the polymeric material constituting the photoresist film expands and "pops" loose the glass immediately thereover. This technique for forming openings in glass films is described in greater detail in the copending application of J. H. Hlista, Ser. No. 635,087, filed May 1, 1967 and assigned to the instant assignee. Alternatively, the device may be subjected to ultrasonic cleaning in a solution which frees or strips the photoresist loose. By either of these techniques both the glass and the photoresist film portions immediately above the base connection pad 6″ and the emitter contacts 8′ are removed so as to expose the metal constituting the base pad 6″ and the emitter contacts 8′.

Figure 5:
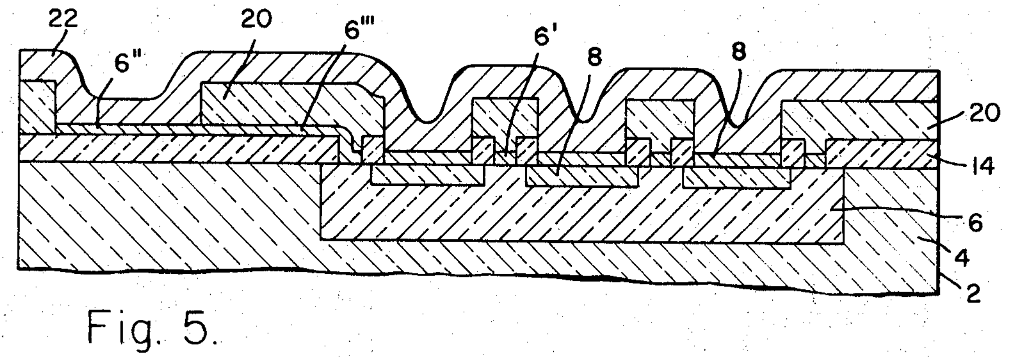

A layer 22 of metal which may be superimposed layers of chromium and gold is formed over the entire surface of the device body including the exposed base pad 6″ and the emitter contacts 8′ as shown in FIG. 5. This metal may be applied by known-vapor-deposition techniques. It should be noted that the metal layer 22 contacts both the base pad 6″ and the emitter contacts 8′ at this stage in the fabrication so that all the openings provided in the glass coating 20 are now electrically connected.

Figure 6:
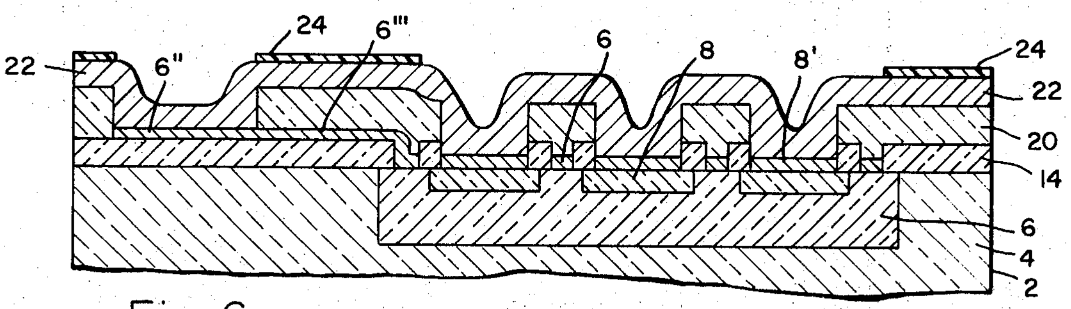

Referring now to FIG. 6, a new film 24 of photoresist is applied to the entire surface of the metal layer 22 just deposited. By appropriate masking, portions of this photoresist film 24 are exposed to a desired light pattern and thereafter are removed by conventional techniques so as to leave portions of the metal film 22 covered with photoresist material. By this step the photoresist film 24 is removed from over the portions of the metal layer 22 which are directly above the base connection pad 6″ and the emitter contacts 8′. In other words, portions of the metal film 22 lying over the base connection pad 6″ and the emitter area including the contacts 8′ are exposed, while all the other portions of the metal layer 22 remain covered by the photoresist metal layer 22.

Figure 7:
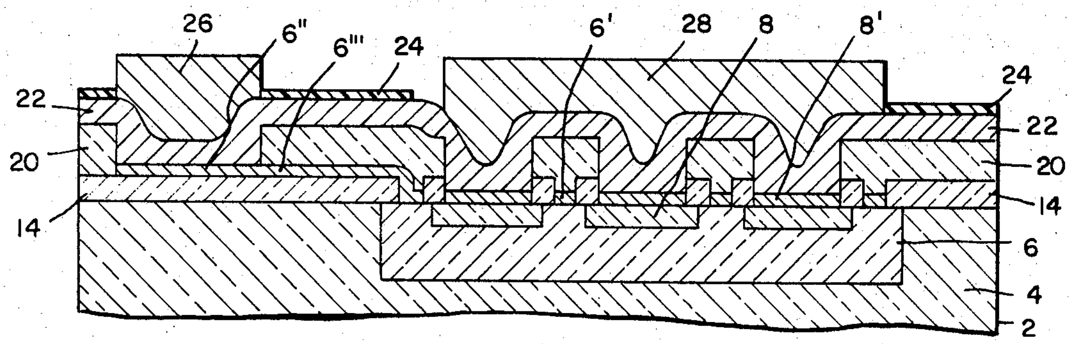

Thereafter, with reference to FIG. 7 and using the metal layer 22 as a plating electrode, the assembly is placed in an electrolytic plating solution and relatively large metallic members 26 and 28 are electroplated in situ over and in contact with the exposed portions of the metallic layer 22. This plating process is described in greater detail in the copending application of K. H. Reissmueller, et al., Ser. No. 511,780, filed Dec. 6, 1965 and assigned to the instant assignee. In this manner a relatively large base connection member 26 is formed on the top surface of the device along with a relatively large emitter contact member 28. It will be understood that the plated base contact member 26 is in electrical contact with the base connection pad 6″ and thence to the various base contact strips 6′ and thus to the base region 6. Similarly, the plated emitter contact member 28 is in electrical contact with the emitter contacts 8′ and thence to the emitter regions 8. A typically satisfactory metal for the members 26 and 28 is silver.

Figure 8:
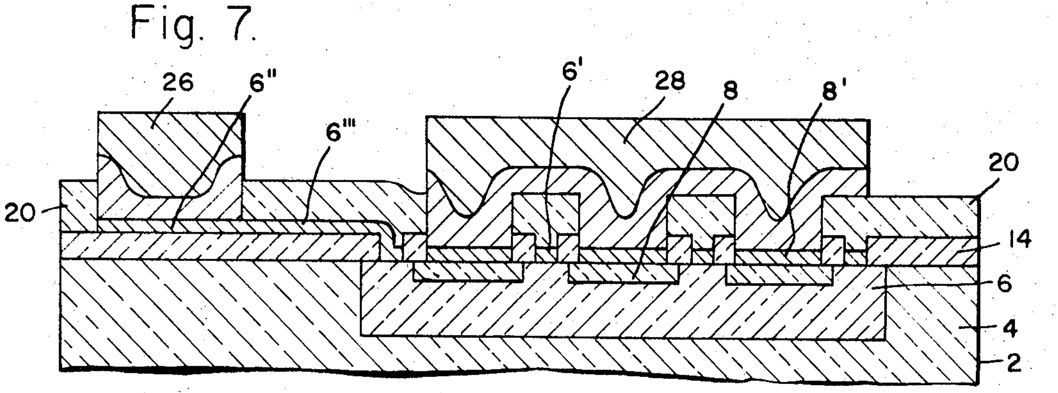

As shown in FIG. 8, the final step is to remove the photoresist film portions 24 still remaining on the surface, as well as portions of the metal layer 22 which were under the photoresist portions 24. The step of removing the exposed portions of the metal film 22 thus results in correcting the temporary electrical connection of the metal in the openings in the glass layer which was necessary to permit simultaneous plating of the emitter and base connections.

In this manner a relatively large emitter contact member 28 is provided which serves as an excellent thermal path for the emitter regions and also as a single electrical contact for a plurality of the emitters. In addition, a relatively large base contact member 26 is provided. The arrangement permits obtaining the necessary electrical connections to the base and emitter regions on the same surface of the semiconductor body while achieving protection or passivation of this surface by the oxide and glass layers and also permitting the removal of heat from the base-emitter junctions from this surface of the semiconductor body, thus avoiding the necessity of extracting the heat by means of a long thermal path through a relatively poor heat-conductive material such as that of the semiconductor body. It is also possible, of course, except in certain special applications, to so mount the transistor as to permit heat to be brought out from the connector or "back" side of the semiconductor body as well. One of the significant advantages of the process of the invention is that the base contact metal is submerged under the protective glass layer while the emitter contact holes can be made through this glass layer without the need for additional masking steps. This advantage results from the use of the photoresist remaining from the previous metal-defining step (to form the emitter contacts 8') to provide holes in the glass without the need for further alignment procedures. In attempting to fabricate devices such as those shown herein by such additional masking procedures, it has been very difficult, if not impossible, to achieve alignment with the emitter contacts 8' when covered by the glass layer. Thus, while the invention has been described in particular reference to a device having a plurality of emitters, it is by no means restricted thereto but may be used to advantage on a device having a single emitter whose area is too small to permit defining a hole thereto through an overlying glass layer.

Also, it is possible according to the invention, to provide an additional opening through the oxide and glass layers on the top surface of the transistor and form a top collector contact structure in the same manner and at the same time the emitter contact structure is fabricated. Such an arrangement would provide contact structures for the base, emitter and collector all on the same surface of the device which would facilitate its usefulness for "flip-chip" attachment to substrates in hybrid circuitry. In such an application such an application such top contacts permit the device "chip" to be flipped over so that the contact structures can be bonded to preselected metallized connections on the substrate.

Devices manufactured according to the present invention have been found to be as thermally good as prior art devices in which the heat was dissipated through the aforementioned back contact mounting on a heat-sink structure. When such a back contact mounting is used in conjunction with the devices according to the present invention, then the heat dissipation is markedly improved over prior art devices not having the emitter and base thermally conductive contact structures of the invention. In order to enhance affixing a device fabricated according to the invention to a heat-sink structure by means of the base and emitter contacts it may be desirable to coat these contact members (which are of silver) with a readily reflowable metal or solder such as silver-tin or lead-tin. This may be accomplished by dipping the contact members into a suitable solder bath. The use of a reflowable metal or solder is desirable because better thermal contact can be obtained therewith.

What is claimed is:

1. The method of providing a planar transistor with a thermally conductive electrical contact member comprising the steps of:

(a) forming a metal layer on the surface of a planar transistor at which portions of the base and emitter regions are exposed through respective openings in an electrically insulating coating on said surface;

(b) forming a film of photosensitive resin material on said metal layer;

(c) removing portions of said photosensitive resin film to expose selected areas of said metal layer while leaving portions of said photosensitive resin film in place at least over the base and emitter regions;

(d) removing the exposed portions of said metal layer while leaving discrete portions of said metal layer on said base and emitter regions;

(e) removing said photosensitive resin film from the portions of said metal layer over the base region;

(f) applying a layer of electrically insulating material over said surface of said transistor, including the portions of said photosensitive resin film remaining on the portions of said metal layer on said emitter region;

(g) removing the portions of the photosensitive film remaining on the portions of said metal layer on said emitter region to thereby provide openings through said layer of electrically insulating material and expose the portions of said metal layer on said emitter region;

(h) applying a layer of electrically conductive material over said layer of electrically insulating material and over the exposed portions of said metal layer on said emitter region;

(i) forming a film of photosensitive resin material on said layer of electrically conductive material;

(j) removing portions of said photosensitive resin film to expose at least the portions of said layer of electrically conductive material over said emitter region;

(k) plating metal onto the exposed portions of said layer of electrically conductive material to form thereat and thereon a thermally and electrically conductive member; and (l) thereafter removing said photosensitive resin film and the portions of said layer of electrically conductive material thereunder.

2. The invention according to claim 1 wherein the layer of electrically insulating material applied in step (f) is glass.

3. The method of providing a planar transistor with thermally conductive electrical contact members comprising the steps of:

(a) forming a metal layer on the surface of a planar transistor at which portions of the base and emitter regions are exposed through respective openings in an electrically insulating coating on said surface;

(b) forming a film of photosensitive resin material on said metal layer;

(c) removing portions of said photosensitive resin film to expose selected areas of said metal layer while leaving portions of said photosensitive resin film in place over the base and emitter regions and over a portion of the electrically insulating coating which is disposed over another region of said transistor adjacent said base region;

(d) removing the exposed portions of said metal layer while leaving discrete portions of said metal layer over said base and emitter regions and over said portion of said electrically insulating coating;

(e) removing said photosensitive resin film from the portions of said metal layer only over said base region;

(f) applying a layer of electrically insulating material over said surface of said transistor including the portions of said photosensitive resin film remaining on said portions of said metal layer over said emitter region and over said portion of said electrically insulating coating;

(g) removing the portions of the photosensitive resin film remaining on the portions of said metal layer over said emitter region and over said portions of said electrically insulating coating to thereby provide openings through said layer of electrically insulating material to expose said portions of said metal layer over said emitter region and over said portions of said electrically insulating coating;

(h) applying a layer of electrically conductive material over said layer of electrically insulating material and over the exposed portions of said metal layer over said emitter region and over said portions of said electrically insulating coating;

(i) forming a film of photosensitive resin material on said layer of electrically conductive material;

(j) removing portions of said photosensitive resin film to expose at least the portions of said layer of electrically conductive material over said emitter region and over said portions of said electrically insulating coating;

(k) plating metal onto the exposed portions of said layer of electrically conductive material to form thereat and thereon discrete thermally and electrically conductive members in contact with said portions of said metal layer over said emitter region and over said portions of said electrically insulating coating; and (l) thereafter removing said photosensitive resin film and the portions of said layer of electrically conductive material thereunder.

4. The method of providing a planar transistor with thermally conductive electrical contact members comprising the steps of:

(a) forming a first metal layer on the surface of a planar transistor at which portions of the base and emitter regions are exposed through respective openings in a layer of silicon oxide on said surface;

(b) forming a film of photosensitive resin material on said first metal layer;

(c) removing portions of said photosensitive resin film to expose selected areas of said first metal layer while leaving portions of said photosensitive resin film in place at least over the base and emitter regions;

(d) removing the exposed portions of said first metal layer while leaving discrete portions of said first metal layer on said base and emitter regions;

(e) removing said photosensitive resin film from the portions of said first metal layer over the base region;

(f) applying a layer of glass over said surface of said transistor, including the portions of said photosensitive resin film remaining on the portions of said first metal layer on said emitter region;

(g) removing the portions of the photosensitive resin film remaining on the portions of said first metal layer on said emitter region to thereby provide openings through said layer of glass and expose the portions of said first metal layer on said emitter region;

(h) applying a second layer of metal over said layer of glass and over the exposed portions of said first metal layer on said emitter region;

(i) forming a film of photosensitive resin material on said second layer of metal;

(j) removing portions of said photosensitive resin film to expose at least the portions of said second layer of metal over said emitter region;

(k) plating metal onto the exposed portions of said second layer of metal to form thereat and thereon a thermally and electrically conductive member; and (l) thereafter removing said photosensitive resin film and the portions of said second layer of metal thereunder.

5. The method according to claim 4 wherein said second layer of metal is silver.

6. The method according to claim 1 wherein the layer of electrically insulating material applied in step (f) is beryllium oxide.

7. The method according to claim 1 including the step of coating said electrically conductive member with solder.

8. The method according to claim 3 including the step of coating said electrically conductive member with solder.

References Cited

UNITED STATES PATENTS

| | | | |
|---|---|---|---|
| 3,449,825 | 6/1969 | Loro | 29—578 |
| 3,514,680 | 12/1968 | Perri et al. | 117—212 |
| 3,269,861 | 8/1966 | Schneble, Jr. et al. | 117—212 |
| 3,237,271 | 3/1966 | Arnold et al. | 29—578 |
| 3,226,612 | 12/1965 | Haenichen | 29—578 |
| 2,914,449 | 12/1959 | Mayer | 117—217 |

ALFRED L. LEAVITT, Primary Examiner

A. GRIMALDI, Assistant Examiner

U.S. Cl. X.R.

29—578; 96—36.2; 117—217; 317—101